United States Patent

Jeung et al.

Patent Number: 6,111,558
Date of Patent: Aug. 29, 2000

[54] LIQUID CRYSTAL DISPLAYS INCLUDING CLOSED LOOP REPAIR LINES AND METHODS OF REPAIRING SAME

[75] Inventors: Jong-in Jeung; Woon-yong Park; Hun-seok Nam, all of Kyonggi-do, Rep. of Korea

[73] Assignee: Samsung Electronics Co., Ltd., Rep. of Korea

[21] Appl. No.: 09/041,273

[22] Filed: Mar. 12, 1998

[30] Foreign Application Priority Data

May 30, 1997 [KR] Rep. of Korea ...... 97-22279

[51] Int. Cl.[7] .................................................. G09G 3/36
[52] U.S. Cl. ............................................. 345/93; 345/204
[58] Field of Search .................... 345/93, 204, 205, 345/206; 349/54

[56] References Cited

U.S. PATENT DOCUMENTS

| | | | |
|---|---|---|---|
| 4,807,973 | 2/1989 | Kawasaki | 345/93 |
| 5,268,678 | 12/1993 | Nakazawa | 345/93 |
| 5,303,074 | 4/1994 | Salisbury . | |
| 5,608,245 | 3/1997 | Martin | 345/93 |
| 5,760,757 | 6/1998 | Tanaka et al. | 345/93 |

*Primary Examiner*—Regina Liang
*Attorney, Agent, or Firm*—Myers Bigel Sibley & Sajovec

[57] ABSTRACT

Repair lines for liquid crystal or other flat panel displays are provided as closed loops by utilizing a second substrate and at least one third substrate between the liquid crystal display thin film transistor substrate and the second substrate. By using closed loop repair lines, more than one data line can be repaired using a single repair line. Moreover, the resistance and/or capacitance may be decreased by using a shorter path than may be the case for an open loop repair line.

29 Claims, 5 Drawing Sheets

LIQUID CRYSTAL DISPLAYS INCLUDING CLOSED LOOP REPAIR LINES AND METHODS OF REPAIRING SAME

FIELD OF THE INVENTION

This invention relates to flat panel displays, and more particularly to repairable flat panel displays.

BACKGROUND OF THE INVENTION

Liquid crystal displays (LCDs) are a well known form of flat panel display. As is well known to those having skill in the art, a liquid crystal display includes a thin film transistor (TFT) substrate that includes a plurality of spaced apart gate lines having first and second ends and a plurality of spaced apart data lines having first and second ends. The plurality of spaced apart data lines intersect the plurality of spaced apart gate lines, generally orthogonally. Liquid crystal displays also generally include a color filter substrate opposite the thin film transistor substrate, and a liquid crystal material between the thin film transistor substrate and the color filter substrate. Each intersecting area of a gate line and a data line includes a thin film transistor and a pixel electrode, to form switching devices. Other flat panel displays may also include a plurality of spaced apart first conductive lines and a plurality of spaced apart second conductive lines on a display substrate, with a plurality of spaced apart first conductive lines intersecting a plurality of spaced apart second conductive lines.

As the size of liquid crystal displays continues to increase and the resolution of liquid crystal displays continue to increase, larger numbers of data lines and gate lines may be formed on the thin film transistor substrate. In fabricating such large numbers of lines, it is desirable for these lines to have low resistance and high durability. Moreover, as the number of lines increase, the likelihood that one of the lines is open circuited also generally increases. Accordingly, it is desirable to provide repairing structures and methods in order to allow a flat panel display to be utilized notwithstanding a short circuit therein.

For example, U.S. Pat. No. 4,688,896 to Castleberry describes a liquid crystal display that includes auxiliary address lines that are used to provide electrical communication with portions of main address lines that, due to the presence of electrical open circuits, would otherwise be electrically isolated. Each auxiliary address line crosses over multiple main address lines, and can be electrically shorted to any such main address line to provide electrical communication therewith. Similarly, for a gas discharge display panel device, U.S. Pat. No. 4,304,450 to Bilsback et al. discloses a repair cable having a plurality of conductors that runs from a termination area at one end of a conductor array to the termination area at the other end of the array. To repair an open circuit, opposite ends of a respective repair cable conductor are connected to the open conductor repair pads.

Unfortunately, as larger liquid crystal display panels having thinner gate lines and data lines are developed, the use of a repair line may unacceptably increase the resistance-capacitance (RC) time delay for the repaired data line or gate line.

Figure 1:
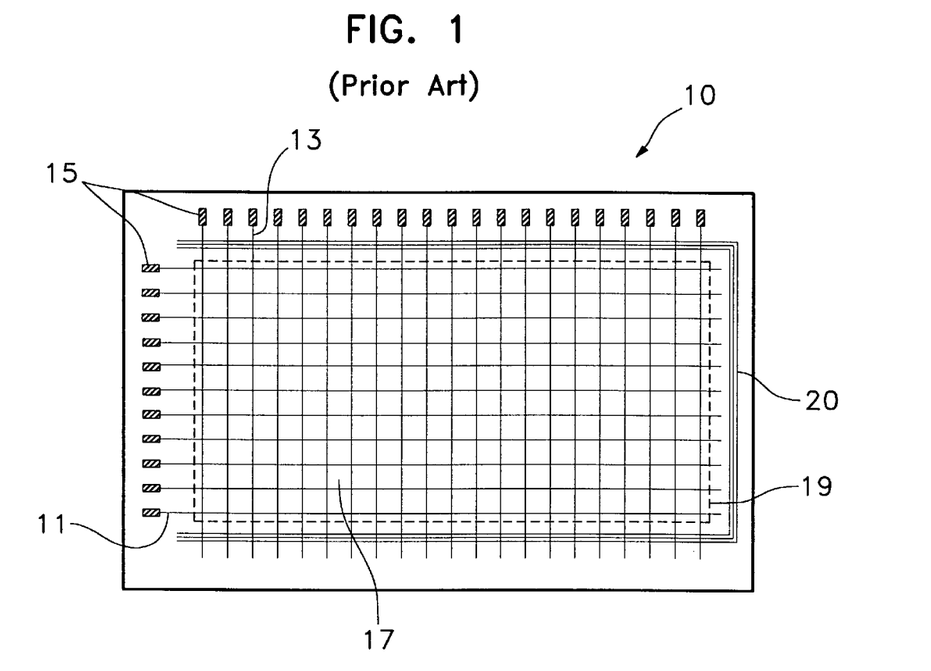
FIG. 1 is a top view of a conventional thin film transistor substrate including repair lines.

Referring now to FIG. 1, a conventional liquid crystal display, including repair lines, and a method for repairing broken data lines will be described. FIG. 1 is a top view of a thin film substrate 10 including repair lines to repair open circuits in the thin film substrate. As shown in FIG. 1, a plurality of gate lines 11 extend horizontally, and a plurality of data lines 13 extend vertically on the thin film substrate 10. Input pads 15 are included at an end of each of the gate lines 11 and data lines 13. A pixel 17 is formed in a pixel region 19 at the intersection of a gate line 11 and a data line 13. A plurality of repair lines 20 is also included, that cross the data lines 13 outside the pixel region 19.

Figure 2:
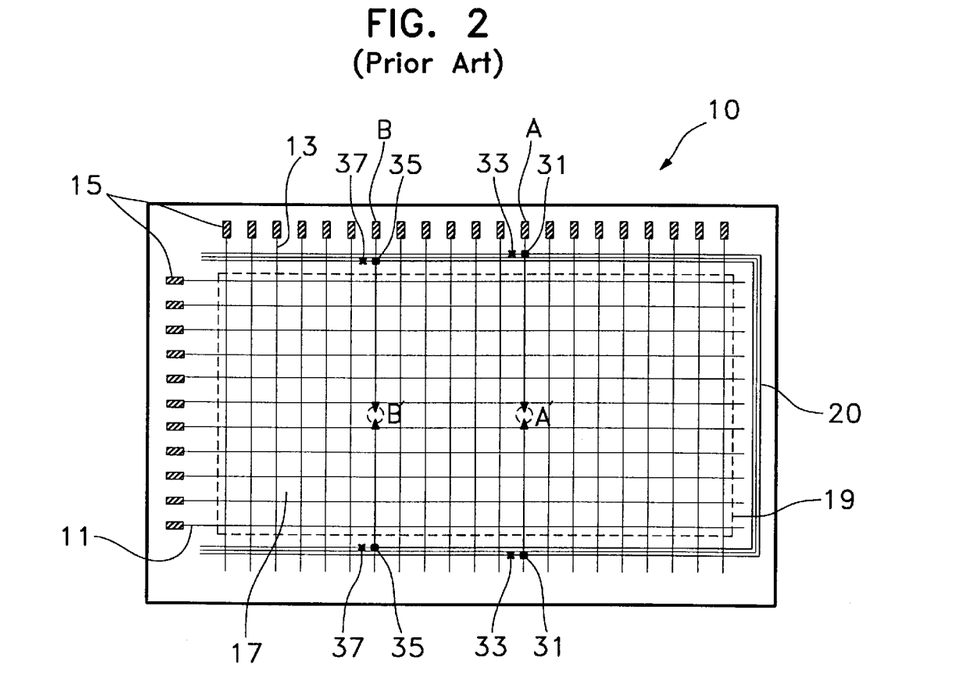
FIG. 2 is a top view of the thin film transistor of FIG. 1 wherein broken data lines are repaired using repair lines.

Referring now to FIG. 2, the method of repairing broken or open circuited data lines using the repair lines 20 is shown. As shown in FIG. 2, intersecting points 31 and 35 where broken data lines 13 meet the repair lines 20, are connected to a repair line 20 using a laser beam or other conventional technique. Thereafter, the repair line 20 is cut at positions 33 and 37. Accordingly, when pixel signals are applied to the broken data lines, the pixel signals go around through the repair line 20 and reach broken points A and B of the broken data lines 13.

As shown in FIG. 2, a single data line generally is repaired using a single repair line. Moreover, depending on the location of the broken data line, a large delay may be introduced due to the resistance and capacitance of the repair line between the opposite ends of the broken data line. This increased delay may be excessive for large, high resolution liquid crystal displays.

SUMMARY OF THE INVENTION

It is therefore an object of the present invention to provide flat panel displays, such as liquid crystal displays, that can use a single repair line to repair multiple data lines.

It is yet another object of the present invention to provide flat panel displays, such as liquid crystal displays, that can repair an open circuited data line using a repair line that can have low resistance and capacitance.

These and other objects are provided, according to the present invention, by providing the repair lines as closed loops by utilizing a second substrate and at least one third substrate between the thin film transistor substrate and the second substrate. By using closed loop repair lines, more than one data line can be repaired using a single repair line. Moreover, the resistance and/or capacitance may be decreased by using a shorter path than may be the case for an open loop repair line.

In particular, liquid crystal displays according to the invention include a thin film transistor substrate including a plurality of spaced apart gate lines having first and second ends and a plurality of spaced apart data lines having first and second ends. The plurality of spaced apart data lines intersect the plurality of spaced apart gate lines, generally orthogonally. A plurality of repair lines are also included on the thin film transistor substrate. The repair lines extend adjacent the first and second ends of the data lines and adjacent the second ends of the gate lines, and are insulated therefrom. A second substrate is located adjacent the first ends of the gate lines. The second substrate includes a plurality of dummy lines.

At least one third substrate is also included between the thin film transistor substrate and the second substrate. The at least one third substrate electrically connects the plurality of repair lines to the plurality of dummy lines, to thereby form closed loop repair lines. The at least one third substrate preferably includes at least one driver integrated circuit and a plurality of connection lines that electrically connect the plurality of repair lines to the plurality of dummy lines. The at least one third substrate is preferably a tape carrier package, and the driver integrated circuit is preferably electrically connected to the first ends of at least some of the gate lines. Also preferably, the thin film transistor substrate includes a patterned conductive layer thereon, and the plurality of spaced apart gate lines and the plurality of repair lines comprise portions of the patterned conductive layer.

The second substrate is preferably a printed circuit board. The second substrate preferably includes an amplifier that is electrically connected to the plurality of dummy lines.

In order to repair a first one of the data lines that includes an open circuit therein, the first end of one of the data lines is connected to a first one of the repair lines adjacent thereto, to define a first connection point. The second end of the first one of the data lines is connected to the first one of the repair lines adjacent thereto, to define a second connection point. The first one of the repair lines is then cut between the first connection point and the second ends of the gate lines, and also is cut between the second connection point and the second ends of the gate lines.

Liquid crystal displays are repaired using the repair lines and the dummy lines, according to the present invention. A first one of the data lines includes a first open circuit therein. The first and second ends of the first ones of the data lines are electrically connected together by a first one of the repair lines. A second one of the data lines includes a second open circuit therein and the first and second ends of the second one of the data lines are electrically connected together by a first one of the dummy lines. Accordingly, two data lines may be repaired using a single repair line, and the resistance between the ends of the open circuited data line may be reduced by utilizing the dummy line or the repair line, depending on the shorter path.

A second one of the data lines between the first and second open circuits and the second ends of the gate lines may also include an open circuit therein. The first end of the second one of the data lines is connected to the first one of the repair lines adjacent thereto, to define a third connection point. The second end of the second one of the data lines is connected to the first one of the repair lines adjacent thereto, to define a fourth connection point. The first one of the repair lines includes a third open circuit between the first open circuit and the third connection point, and a fourth open circuit between the second open circuit and the fourth connection point.

A driver apparatus for a liquid crystal display according to the invention includes a driver substrate, referred to above as a third substrate, and a driver integrated circuit on the driver substrate. A plurality of first conductive lines on the driver substrate extend from the driver integrated circuit to a first side of the driver substrate, to supply drive signals from the driver integrated circuit to the liquid crystal display. A plurality of second conductive lines on the driver substrate extend from the first side of the driver substrate to a second side of the driver substrate opposite the first side. A plurality of third conductive lines may extend adjacent a second side of the driver integrated circuit, opposite the second conductive lines, and extending from the first side of the driver substrate to the second side of the driver substrate. The driver substrate is preferably a tape carrier package.

A repair apparatus for a liquid crystal display may include a substrate, referred to above as a second substrate, and a plurality of conductive lines on the substrate, referred to above as dummy lines. The plurality of conductive lines extend from a first side of the substrate adjacent a second side of the substrate, to the first side of the substrate adjacent a third side of the substrate. A plurality of conductive lines are configured to electrically connect to a plurality of repair lines on the liquid crystal display, such that the plurality of repair lines and the plurality of conductive lines can repair open circuits in the liquid crystal display. An amplifier may also be included on the substrate, electrically connected to the plurality of conductive lines. The substrate is preferably a printed circuit board.

Liquid crystal displays may be repaired according to the present invention by placing a second substrate including a plurality of dummy lines adjacent the first ends of the gate lines and electrically connecting at least one third substrate between the thin film transistor substrate and the second substrate, to electrically connect the plurality of repair lines to the plurality of dummy lines. If a first one of the data lines includes an open circuit therein, the first end of the first one of the data lines is connected to a first one of the repair line adjacent thereto, to define a first connection point. The second end of the first one of the data lines is connected to the first one of the repair lines adjacent thereto, to define a second connection point. The first one of the repair lines is then open circuited between the first and second connection points, so that the dummy lines are used for interconnection.

In particular, a first open circuit is formed in the first one of the repair lines between the first connection point and the second ends of the gate lines, and a second open circuit is formed in the first one of the repair lines between the second connection point and the second ends of the gate lines. If a second one of the data lines between the first and second open circuits and the second ends of the gate lines includes an open circuit, this open circuit can be repaired by connecting the first end of the second one of the data lines to the first one of the repair lines adjacent thereto, to define a third connection point. The second end of the second one of the data lines is connected to the first one of the repair lines adjacent thereto, to define a fourth connection point. A third open circuit is formed in the first one of the repair lines between the first open circuit and the third connection point. A fourth open circuit is formed in the first one of the repair lines between the second open circuit and the fourth connection point.

Accordingly, multiple defective data lines can be repaired using a single repair line. Moreover, the combination of repair lines and dummy lines provides a closed path around the display, so that a shortest path length can be used for repair, to thereby reduce resistance and/or capacitance.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 3:
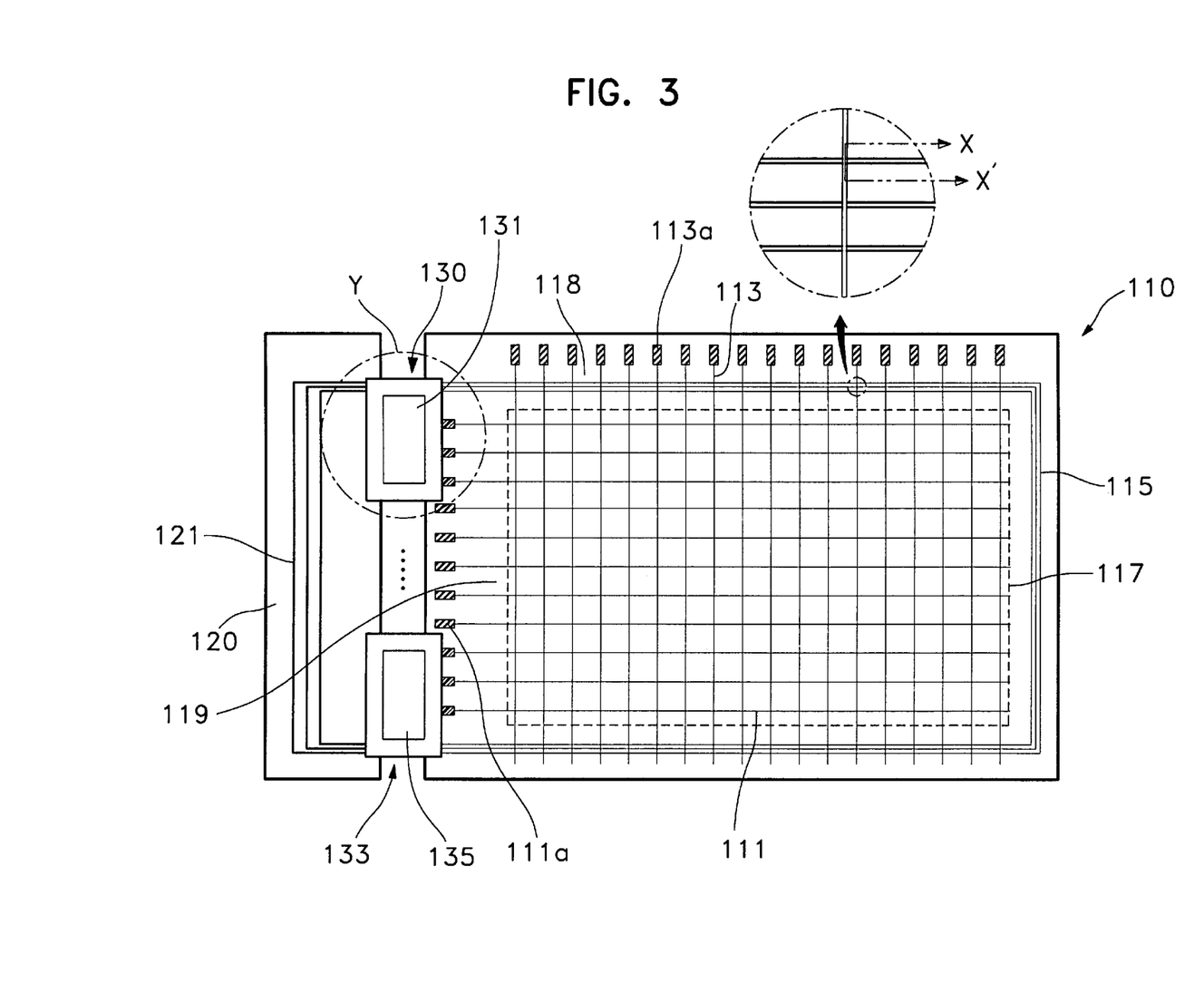
FIG. 3 is a schematic top view of a first embodiment of liquid crystal displays according to the present invention.

Referring to FIG. 3, a schematic top view of a first embodiment of a liquid crystal display according to the present invention is shown. As shown in FIG. 3, a thin film transistor substrate 110 includes an active region 117 on which a plurality of spaced apart gate lines 111 and a plurality of spaced apart data lines 113 intersect each other, preferably orthogonally. The first ends 119 of the gate lines 111 include a gate line pad 111a. The first ends 118 of the data lines 113 include a data line pad 113a. The second ends of the data lines and the gate lines do not include pads in FIG. 3, although pads may be provided.

Still referring to FIG. 3, a plurality of repair lines 115 are also included on the thin film transistor substrate 110. The repair lines extend adjacent the first and second ends of the data lines and adjacent the second ends of the gate lines. Accordingly, the repair lines 115 are formed in an angular C shape, which includes an opening at the first ends 119 of the gate lines 111. Thus, the repair lines 115 intersect the data lines 113 at two points on each of the data lines 113.

Figure 4A:
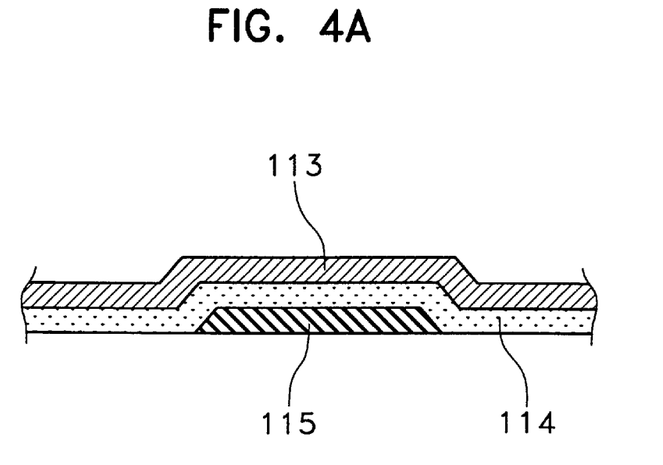
FIG. 4A is a cross-sectional view taken along the line X–X' of FIG. 3.

As already described, the repair lines 115 are open loops because, among other reasons, the repair lines 115 are preferably formed of the same layer as the gate lines 111. In particular, the thin film transistor substrate 110 includes a patterned conductive layer thereon, and the plurality of spaced apart gate lines 111 and repair lines 115 comprise portions of the patterned conductive layer. The patterned conductive layer is preferably a low resistance metal, such as aluminum. Moreover, after the repair lines 115 are formed of the same patterned layer as the gate lines 111, an insulating layer 114 is formed on the repair lines 115 as shown in FIG. 4A. Then, the data lines 113 are formed on the insulating layer 114. Since the insulating layer 114 is located between the data lines 113 and the repair lines 115, they can intersect without electrically interconnecting. In contrast, if the repair lines 115 and the gate lines 111 intersect each other, a short may occur because the gate lines 111 and the repair lines 115 are formed of the same metal layer. Therefore, the repair lines 115 preferably are formed as open loops at the first ends 119 of the gate lines 111.

Referring again to FIG. 3, a second substrate 120 is located adjacent the first ends 119 of the gate lines 111. The second substrate 120 is preferably a printed circuit board. The second substrate 120 includes thereon a plurality of dummy lines 121 that extend from a first side of the second substrate 120 adjacent a second side of the second substrate to the first side of the second substrate adjacent a third side of the second substrate. The dummy lines 121 are configured to electrically connect to the plurality of repair lines 115, as will now be described. The second substrate is also referred to as a gate printed circuit board (PCB).

Still referring to FIG. 3, at least one third substrate 130, 133 is located between the thin film transistor substrate 110 and the second substrate 120. The third substrate is also referred to as a driver substrate. Each third substrate is used to electrically connect the plurality of repair lines 150 to the plurality of dummy lines 121. Moreover, the at least one third substrate 130, 133 preferably includes thereon at least one driver integrated circuit 131, 135, and a plurality of connection lines that electrically connect the plurality of repair lines to the plurality of dummy lines. These lines will be described in detail in connection with FIG. 4B. Preferably, the third substrates 130, 133 are tape carrier packages. Thus, the at least one third substrates are also referred to as tape carrier packages (TCPs).

Accordingly, the first ends 119 of the gate lines 111 are connected to the PCB 120 by a plurality of TCPs 130 and 133. Input leads on the TCPs 130 and 133 are bonded to metallic lines that are printed on the gate PCB 120, as will be described in detail below. Output leads on the TCPs 130 and 133 are bonded to the input pads 111a and the repair lines 115 as will be described in detail below. Thus, electrical signals can be transmitted to the gate lines 111 and the repair lines 115, and the repair lines 115 can function as closed loops.

Figure 4B:
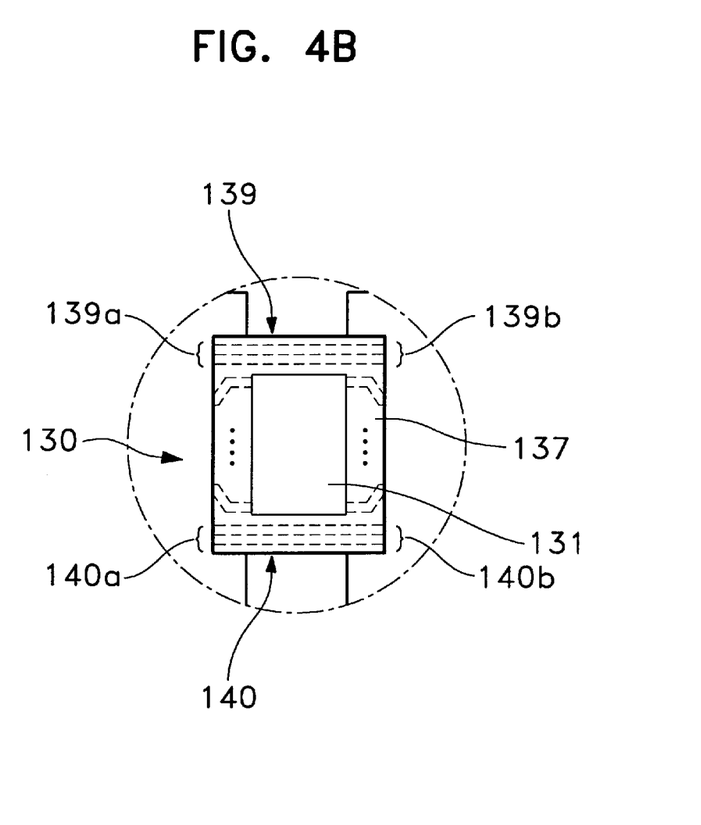
FIG. 4B is a magnified view of the portion Y of FIG. 3.

FIG. 4B illustrates the details of one of the third substrates 130, also referred to as a driver substrate. A driver integrated circuit 131 is included on the driver substrate 130. A plurality of first conductive lines 137 are included on the driver substrate that extend from the driver integrated circuit 131 to a second (right) side of the driver substrate, to supply drive signals from the driver integrated circuit to the gate lines. The first conductive lines may also extend from the driver integrated circuit 131 to a first (left) side of the driver substrate. A plurality of second conductive lines 139, have first ends 139a at the first (left) side and second ends 139b at the second (right) side of the substrate 130. The plurality of second conductive lines 139 is adjacent a first (top) side of the driver integrated circuit 131. A plurality of third conductive lines 140 adjacent a second (bottom) side of the driver integrated circuit 131 opposite the first side of the driver integrated circuit, have first ends 140a at a first (left) side and have second ends 140b at the second (right) side of the substrate 130.

Preferably, the number of second conductive lines 139 and third conductive lines 140 corresponds to the number of repair lines 115. The second conductive lines 139 and the third conductive lines 140 preferably are formed on the upper and lower portions of the driver substrate 130. The second ends 139b of the second conductive lines 139 are connected to the repair lines 115, and the first ends 139a of the second lines 139 are connected to the dummy lines 121 on the topmost third substrate 130. Similar connections are made for third conductive lines 140 in the bottommost third substrate 133. As a result, the repair lines 115 become a closed loop.

Figure 5:
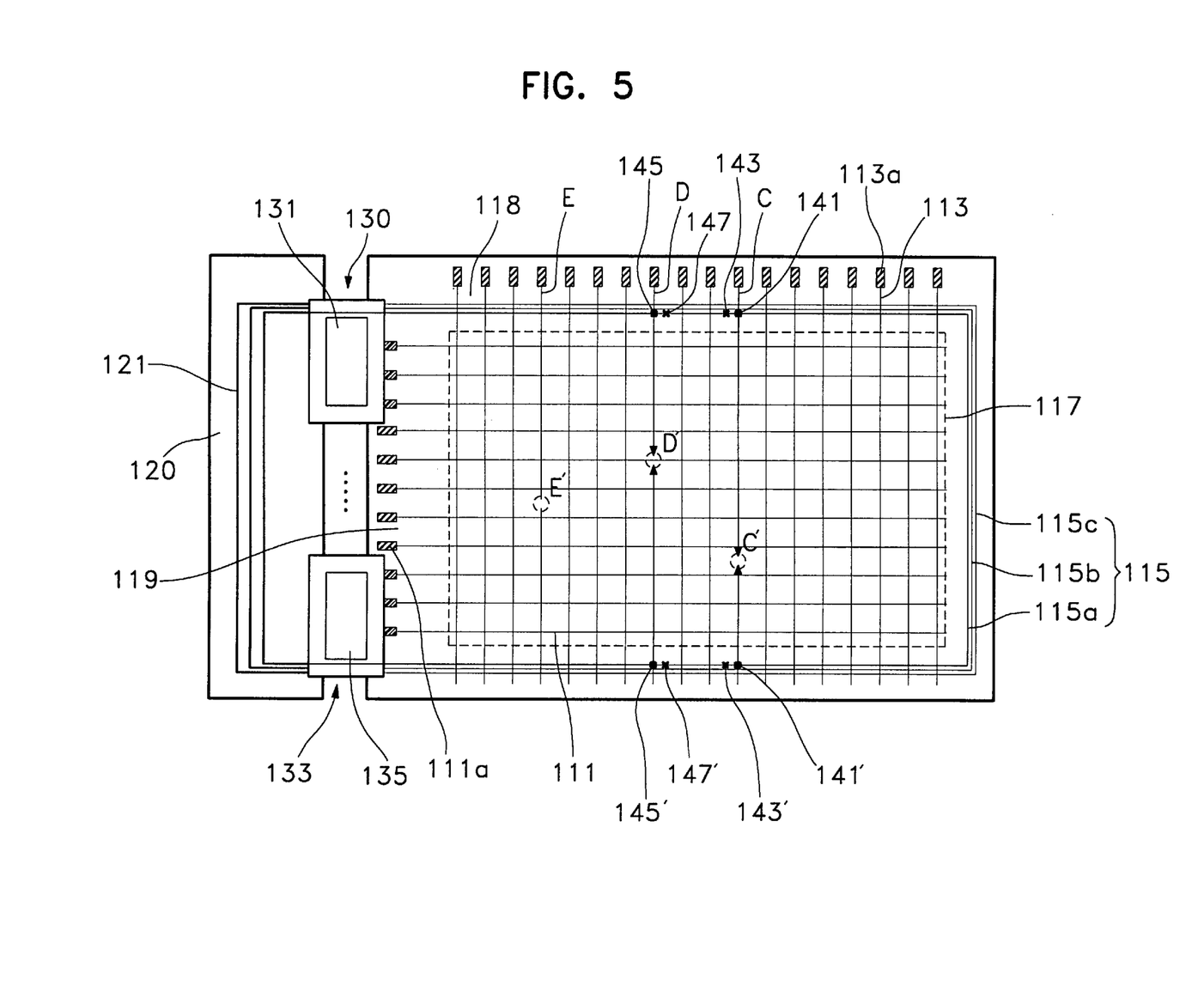
FIG. 5 is a top view of the liquid crystal displays of FIG. 3, wherein broken data lines are repaired using repair lines according to the present invention.

A method of repairing broken data lines using the gate PCB and the repair lines will now be described with reference to FIG. 5. As is well known, in order to test the pixel state of an LCD panel, the gate lines and the data lines 113 are energized. As shown in FIG. 5, it is determined that data lines C, D and E are broken at predetermined positions C', D' and E'. The broken data lines C, D and E may be repaired as follows:

In order to repair broken line D, the first end of the broken data line D is connected to a first one of the repair lines 115a adjacent thereto, to define a first connection point 145. The second end of the first one of the data lines D is connected to the first one of the repair lines 115a adjacent thereto, to define a second connection point 145'. In order to utilize the dummy lines 121 to connect the open circuited data line D, the first one of the repair lines 115a is open circuited between the first and second connection points. More specifically, a first open circuit 147 is formed in the first one of the repair lines 115a between the first connection point 145 and the second ends of the gate lines. A second open circuit 147' is formed in the first one of the repair lines 115a between the second connection point 145' and the second ends of the gate lines.

The first repair line 115a may also be used to repair an open circuit C' in a second one C of the data lines, between the first and second open circuits 147 and 147' and the second ends of the gate lines. In particular, the first end of the second one of the data lines C is connected to the first one of the repair lines 115a adjacent thereto, to define a third connection point 141. The second end of the second one of the data lines is connected to the first one of the repair lines 115a adjacent thereto, to define a fourth connection point 141'. A third open circuit 143 is formed in the first one of the repair lines 115a between the first open circuit 147 and the third connection point 141. A fourth open circuit 143' is formed in the first one of the repair lines 115a between the second open circuit 147' and the fourth connection point 141'. Accordingly, the repair line 115a extending around the second (right) ends of the gate lines 111 is used to repair open circuit C'.

Thus, the broken data line C that is remote from the first ends 119 of the gate lines 111 is repaired using only the repair lines 115 to reduce the resistance and/or capacitance. The broken data line D that is formed at the center portion of the substrate 110 can be repaired using only the repair lines 115 or by using the repair lines 115 and the gate PCB 120.

If the broken data line D is repaired using only the repair lines 115, then the first repair line 115a is not used to repair data line C. Rather, a second repair line 115b or a third repair line 115c is used. This is because repair lines 115 are formed in open loops. Thus, since predetermined points in the first repair line 115a are cut, the signals from the source are not transmitted through the data line D, even though the data line D is also connected to the first repair line 115a. However, if the broken data line D is repaired using the repair lines 115 together with the gate PCB 120, all of the repair lines 115 can be used because the first and the second TCPs 130 and 133 and the gate PCB 120 make the repair lines 115 function as closed loops. When the broken data line D is repaired using the repair lines 115 together with the gate PCB 120, the resistance of the repair lines 115 can be reduced more than when using only the repair lines 115, because the dummy lines 121 on the gate PCB 120 can be wider than repair lines 115.

It will be understood that the connection of data lines to repair lines may be accomplished by destroying the insulator layer 114 using a laser beam. The metal of the data line is then soaked into the insulating layer 114. Moreover, the repair lines may be open circuited as desired using a laser to cut the repair lines 115. Other connecting and opening techniques may be used.

When the broken data line E is repaired, it is preferable to use the repair lines 115 together with the gate PCB 120, because the broken data line E is closer to the first ends 119 of gate lines 111. Thus, if only the repair lines 115 were used, the resistance of the repair lines may become large due to the long length thereof.

The broken data line E can be repaired using the second or third repair lines 115b and 115c respectively. The first repair line 115 is not used, because it has already been used to repair the broken data lines C and D. The method for repairing the broken data line E is the same as repairing broken data line D using the repair line 115 and the gate PCB 120. Accordingly, it need not be described in detail. 1

It will be understood by those having skill in the art that the broken points C', D' and E' are generally so minute that they cannot be readily identified by visual inspection. Accordingly, defective liquid crystal displays may be repaired.

Figure 6:
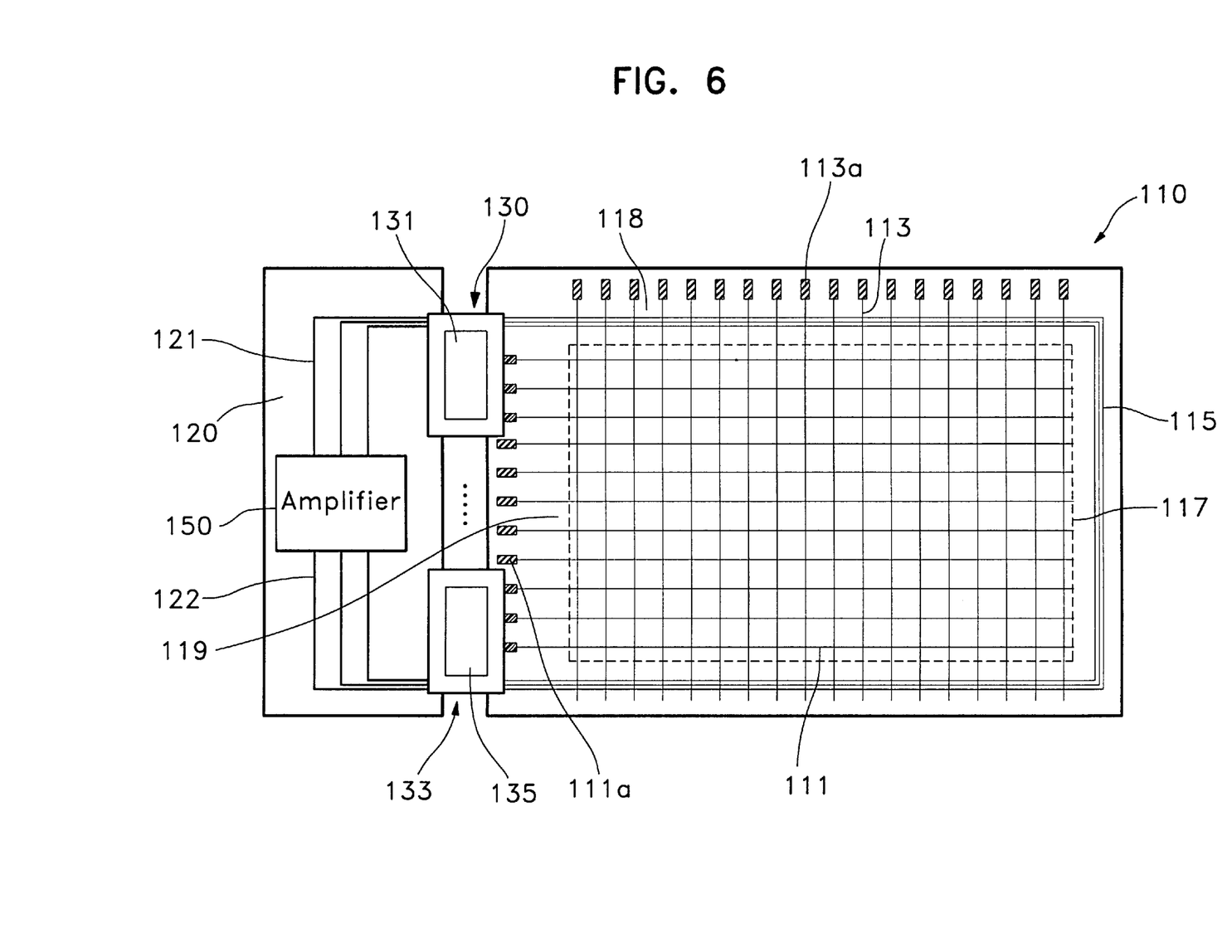
FIG. 6 is a schematic top view of a second embodiment of liquid crystal displays according to the present invention.

Referring now to FIG. 6, a schematic top view of the second embodiment of liquid crystal displays according to the present invention is shown. As shown in FIG. 6, the LCDs include an amplifier 150 on the second substrate (PCB) 120. The amplifier 150 is located on a predetermined portion of the dummy lines 121 and 122, and amplifies the pixel signals from the source. Inputs of the amplifier 150 are bonded to the dummy lines 121 that are connected to the first TCP 130. Outputs of the amplifier 150 are bonded to the dummy lines 122 that are connected to the second TCP 133. Preferably, the amplifier 150 is a driver integrated circuit including current amplifiers for amplifying current or voltage amplifiers for amplifying voltage. The amplifier 150 selectively amplifies current or voltage signals from the source, and thereby can compensate for delays caused by the resistance and capacitance of the repair lines 115. Amplifiers may be particularly desirable for large LCD panels, wherein the resistance and the capacitance may become excessive.

Accordingly, repair lines on the edge portions on thin film transistor substrates are formed in closed loops using a gate printed circuit board and tape carrier packages including gate driving integrated circuits. An amplifier may be included on the gate printed circuit board. Accordingly, two broken data lines can be repaired using one repair line. Moreover, the resistance and/or capacitance of the repaired data lines can be maintained acceptably low so that high performance may be obtained. Alternatively, data lines that could not be repaired because of the resistance of the repair lines, can now be repaired. Reduced cost and increased yields may be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A liquid crystal display comprising:
   a thin film transistor (TFT) substrate including a plurality of spaced apart gate lines having first and second ends and a plurality of spaced apart data lines having first and second ends, the plurality of spaced apart data lines intersecting the plurality of spaced apart gate lines;
   a plurality of repair lines on the TFT substrate, the repair lines extending adjacent the first and second ends of the data lines and adjacent the second ends of the gate lines, and being insulated therefrom;
   a second substrate including a plurality of dummy lines and an amplifier that is electrically connected to the plurality of dummy lines, each of the plurality of dummy lines being independently configured to electrically connect to the plurality of repair lines; and
   at least one third substrate between the TFT substrate and the second substrate that electrically connects the plurality of repair lines to the plurality of dummy lines.

2. A liquid crystal display according to claim 1 wherein the at least one third substrate includes at least one driver integrated circuit and a plurality of connection lines that electrically connect the plurality of repair lines to the plurality of dummy lines.

3. A liquid crystal display according to claim 2 wherein the at least one third substrate is at least one tape carrier package.

4. A liquid crystal display according to claim 2 wherein the at least one driver integrated circuit is electrically connected to the first ends of at least some of the gate lines.

5. A liquid crystal display according to claim 1 wherein the TFT substrate includes a patterned conductive layer thereon, and wherein the plurality of spaced apart gate lines and the plurality of repair lines comprise portions of the patterned conductive layer.

6. A liquid crystal display according to claim 1 wherein the second substrate is a printed circuit board.

7. A liquid crystal display according to claim 1 wherein a first one of the data lines includes an open circuit therein, the first end of the first one of the data lines being connected to a first one of the repair lines adjacent thereto to define a first connection point, and the second end of the first one of the data lines being connected to the first one of the repair lines adjacent thereto to define a second connection point, the first one of the repair lines including an open circuit between the first and second connection points.

8. A liquid crystal display according to claim 7 wherein the first one of the repair lines includes a first open circuit between the first connection point and the second ends of the gate lines and a second open circuit between the second connection point and the second ends of the gate lines.

9. A liquid crystal display according to claim 8 wherein a second one of the data lines between the first and second open circuits and the second ends of the gate lines includes an open circuit therein, the first end of the second one of the data lines being connected to the first one of the repair lines adjacent thereto to define a third connection point and the second end of the second one of the data lines being connected to the first one of the repair lines adjacent thereto to define a forth connection point, the first one of the repair lines including a third open circuit between the first open circuit and the third connection point and a forth open circuit between the second open circuit and the forth connection point.

10. A liquid crystal display according to claim 1 wherein a first one of the data lines includes a first open circuit therein, and wherein the first and second ends of the first one of the data lines are electrically connected together by a first one of the repair lines, and wherein a second one of the data lines includes a second open circuit therein, and wherein the first and second ends of the second one of the data lines are electrically connected together by a first one of the dummy lines.

11. A liquid crystal display according to claim 1 wherein the first one of the repair lines is electrically connected to the first one of the dummy lines by the at least one third substrate.

12. A liquid crystal display according to claim 1, wherein the second substrate is arranged adjacent the first ends of the gate lines.

13. A repair apparatus for a liquid crystal display comprising:
a substrate;
a plurality of conductive lines on the substrate, the plurality of conductive lines extending from a first side of the substrate adjacent a second side of the substrate, to the first side of the substrate adjacent a third side of the substrate, the plurality of conductive lines being configured to electrically connect to a plurality of repair lines on a liquid crystal display, such that the plurality of repair lines and the plurality of conductive lines can repair open circuits in the liquid crystal display; and
an amplifier mounted on the substrate and electrically connected to the plurality of conductive lines.

14. A repair apparatus according to claim 13 wherein the substrate is a printed circuit board.

15. A method of repairing a liquid crystal display comprising a thin film transistor (TFT) substrate including a plurality of spaced apart gate lines having first and second ends and a plurality of spaced apart data lines having first and second ends, the plurality of spaced apart data lines intersecting the plurality of spaced apart gate lines, and a plurality of repair lines extending adjacent the first and second ends of the data lines and adjacent the second ends of the gate lines and being insulated therefrom, the repair method comprising the steps of:
placing a second substrate including a plurality of dummy lines adjacent the first ends of the gate lines and an amplifier electrically connected to the plurality of dummy lines, each of the plurality of dummy lines being independently configured to electrically connect to the plurality of repair lines; and
electrically connecting at least one third substrate between the TFT substrate and the second substrate, to electrically connect the plurality of repair lines to the plurality of dummy lines.

16. A repairing method according to claim 15 wherein a first one of the data lines includes an open circuit therein, the method further comprising the steps of:
connecting the first end of the first one of the data lines to a first one of the repair lines adjacent thereto to define a first connection point;
connecting the second end of the first one of the data lines to the first one of the repair lines adjacent thereto to define a second connection point; and
open circuiting the first one of the repair lines between the first and second connection points.

17. A repairing method according to claim 16 wherein open circuiting step comprises step of:
forming a first open circuit in the first one of the repair lines between the first connection point and the second ends of the gate lines; and
forming a second open circuit in the first one of the repair lines between the second connection point and the second ends of the gate lines.

18. A repairing method according to claim 17 wherein a second one of the data lines between the first and second open circuits and the second ends of the gate lines includes an open circuit therein, the repairing method further comprising the steps of:
connecting the first end of the second one of the data lines to the first one of the repair lines adjacent thereto to define a third connection point;
connecting the second end of the second one of the data lines to the first one of the repair lines adjacent thereto to define a forth connection point;
forming a third open circuit in the first one of the repair lines between the first open circuit and the third connection point; and
forming a forth open circuit in the first one of the repair lines between the second open circuit and the forth connection point.

19. A flat panel display comprising:

a display substrate including a plurality of spaced apart first conductive lines having first and second ends and a plurality of spaced apart second conductive lines having first and second ends, the plurality of spaced apart first conductive lines intersecting the plurality of spaced apart second conductive lines;

a plurality of repair lines on the display substrate, the repair lines extending adjacent the first and second ends of the second conductive lines and adjacent the second ends of the first conductive lines, and being insulated therefrom;

a second substrate adjacent the first ends of the first conductive lines and including a plurality of third conductive lines and an amplifier electrically connected to the plurality of third conductive lines, each of the plurality of third conductive lines being independently configured to electrically connect to the plurality of repair lines; and at least one third substrate between the display substrate and the second substrate that electrically connects the plurality of repair lines to the plurality of third conductive lines.

20. A flat panel display according to claim 19 wherein the at least one third substrate includes at least one driver integrated circuit and a plurality of connection lines that electrically connect the plurality of repair lines to the plurality of third conductive lines.

21. A flat panel display according to claim 20 wherein the at least one third substrate is at least one tape carrier package.

22. A flat panel display according to claim 20 wherein the at least one driver integrated circuit is electrically connected to the first ends of at least some of the second conductive lines.

23. A flat panel display according to claim 19 wherein the display substrate includes a patterned conductive layer thereon, and wherein the plurality of spaced apart second conductive lines and the plurality of repair lines comprise portions of the patterned conductive layer.

24. A flat panel display according to claim 19 wherein the second substrate is a printed circuit board.

25. A flat panel display according to claim 19 wherein a first one of the first conductive lines includes an open circuit therein, the first end of the first one of first conductive lines being connected to a first one of the repair lines adjacent thereto to define a first connection point, and the second end of the first one of the first conductive lines being connected to the first one of the repair lines adjacent thereto to define a second connection point, the first one of the repair lines including an open circuit between the first and second connection points.

26. A flat panel display according to claim 25 wherein the first one of the repair lines includes a first open circuit between the first connection point and the second ends of the second conductive lines and a second open circuit between the second connection point and the second ends of the second conductive lines.

27. A flat panel display according to claim 26 wherein a second one of the first conductive lines between the first and second open circuits and the second ends of the second conductive lines includes an open circuit therein, the first end of the second one of the first conductive lines being connected to a first one of the repair lines adjacent thereto to define a third connection point and the second end of the second one of the first conductive lines being connected to the first one of the repair lines adjacent thereto to define a forth connection point, the first one of the repair lines including a third open circuit between the first open circuit and the third connection point and a forth open circuit between the second open circuit and the forth connection point.

28. A flat panel display according to claim 19 wherein a first one of the first conductive lines includes a first open circuit therein, and wherein the first and second ends of the first one of the first conductive lines are electrically connected together by a first one of the repair lines, and wherein a second one of the first conductive lines includes a second open circuit therein, and wherein the first and second ends of the second one of the first conductive lines are electrically connected together by a first one of the third conductive lines.

29. A flat panel display according to claim 19 wherein the first one of the repair lines is electrically connected to the first one of the third conductive lines by the at least one third substrate.

* * * * *

UNITED STATES PATENT AND TRADEMARK OFFICE
CERTIFICATE OF CORRECTION

PATENT NO. : 6,111,558
DATED : August 29, 2000
INVENTOR(S) : Jong-in Jeung et al.

It is certified that error appears in the above-identified patent and that said Letters Patent is hereby corrected as shown below:

[56] References Cited

Please add:

4,688,896   08/25/87   Castleberry      350/333
4,304,450   12/08/81   Bilsback et al.  316/2

Signed and Sealed this

Twenty-ninth Day of May, 2001

Attest:

NICHOLAS P. GODICI

Attesting Officer          Acting Director of the United States Patent and Trademark Office